United States Patent
Takeshita (10) Patent No.: US 9,627,963 B2
(45) Date of Patent: Apr. 18, 2017

(54) VOLTAGE GENERATION CIRCUIT, FLASH MEMORY AND SEMICONDUCTOR DEVICE

(71) Applicant: WINBOND ELECTRONICS CORP., Taichung (TW)

(72) Inventor: Toshiaki Takeshita, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/012,424

(22) Filed: Feb. 1, 2016

(65) Prior Publication Data
US 2016/0226377 A1    Aug. 4, 2016

(30) Foreign Application Priority Data
Feb. 4, 2015    (JP) .................................. 2015020498

(51) Int. Cl.
| | |
|---|---|
| *G11C 16/10* | (2006.01) |
| *H02M 3/07* | (2006.01) |
| *G11C 16/30* | (2006.01) |
| *G11C 5/14* | (2006.01) |

(52) U.S. Cl.
CPC ............. *H02M 3/07* (2013.01); *G11C 16/30* (2013.01); *H02M 3/073* (2013.01); *G11C 5/145* (2013.01); *G11C 5/147* (2013.01)

(58) Field of Classification Search
USPC .................................................. 365/185.18
See application file for complete search history.

(56) References Cited

U.S. PATENT DOCUMENTS

| | | | |
|---|---|---|---|
| 6,531,912 B2 | 3/2003 | Katou | |
| 2001/0030364 A1* | 10/2001 | Katou | H02M 3/07 257/756 |
| 2012/0063208 A1* | 3/2012 | Koyama | G11C 5/025 365/149 |

FOREIGN PATENT DOCUMENTS

| | | |
|---|---|---|
| JP | 2012244660 A | 12/2012 |
| JP | 2013038234 | 2/2013 |

(Continued)

*Primary Examiner* — Hoai V Ho
*Assistant Examiner* — Minh Dinh
(74) *Attorney, Agent, or Firm* — Muncy, Geissler, Olds & Lowe, P.C.

(57) ABSTRACT

A voltage generation circuit is provided to suppress the required layout of the voltage generation circuit and stabilize the output voltage thereof.
[Solution]
A voltage generation circuit 100A according to the present invention includes a charge pump circuit 20, a resistor voltage-division circuit 120, a comparator 34 having a voltage Vm output from the resistor voltage-division circuit 120 and a reference voltage, and a control circuit 36 controlling the operation of the charge pump circuit 20 based on the comparison result of the comparator 34. The resistor voltage-division circuit 120 includes resistors R1~R4 connected in series between an output node $N_{OUT}$ and a ground and generates the voltage Vm at a voltage-division node $N_R$ in response to an output voltage $V_{OUT}$. The resistor voltage-division circuit 120 further includes a parasitic capacitor Cp to capacitively couple the resistors R1, R2, R3 and R4 to the output node $N_{OUT}$.

15 Claims, 7 Drawing Sheets

(56) References Cited

FOREIGN PATENT DOCUMENTS

| JP | 2013157053 A | 8/2013 |
|----|--------------|--------|
| KR | 20010085577  | 9/2001 |

\* cited by examiner

VOLTAGE GENERATION CIRCUIT, FLASH MEMORY AND SEMICONDUCTOR DEVICE

CROSS REFERENCE TO RELATED APPLICATIONS

The application is based on, and claims priority from, Japan Patent Application Serial No. JP 2015-020498, filed on Feb. 4, 2015, the disclosure of which is hereby incorporated by reference herein in its entirety.

BACKGROUND OF THE INVENTION

Field of the Invention

The present invention relates to a voltage generation circuit capable of monitoring an output voltage and generating a required voltage at the same time, and in particular it relates to a voltage generation circuit generating the required voltage for operation of a semiconductor device comprising a flash memory and other integrated circuits.

Description of the Related Art

As semiconductor design scales down in dimensions, the operation voltages and the power-supply voltages of semiconductor devices are reduced accordingly. For example, the power-supply voltage outside a semiconductor device is decreased from 3.3 V to either 2.5 V or 1.8 V. On the other hand, the internal circuits of semiconductor devices may require multiple voltage supplies, including voltage for driving transistors, and voltage applied to a substrate and well regions, which are higher than the external power-supply voltage. Therefore, semiconductor devices have voltage-boosting circuits to raise external power-supply voltages to the required voltages and level shift circuits.

Japanese laid-open patent application No. 2012-244660 discloses a NAND-type flash memory with a voltage-boosting circuit. The voltage-boosting circuit comprises a charge pump. The current consumption and layout (area) of the voltage-boosting circuit are reduced by decreasing number of stages in the charge pump. Japanese laid-open patent application No. 2013-157053 also discloses a NAND-type flash memory with a voltage generation circuit. The voltage generation circuit has a charge pump circuit and a clamp circuit. The clamp circuit monitors output voltages of the charge pump circuit to control the charge pump circuit. The clamp circuit has a first resistor device, a second resistor device, a first capacitor device, a second capacitor device, a switch device and a comparator. One input of the comparator is connected to connection portions of the first and second resistor devices, and the other input of the comparator is input by a reference voltage. In addition, the first capacitor device is connected between the output of the charge pump circuit and one input of the comparator. When the output of the charge pump circuit is connected to a load, the second capacitor device is connected to one input of the comparator through the switch device so as to stabilize the boosted voltage.

BRIEF SUMMARY OF THE INVENTION

Figure 1:
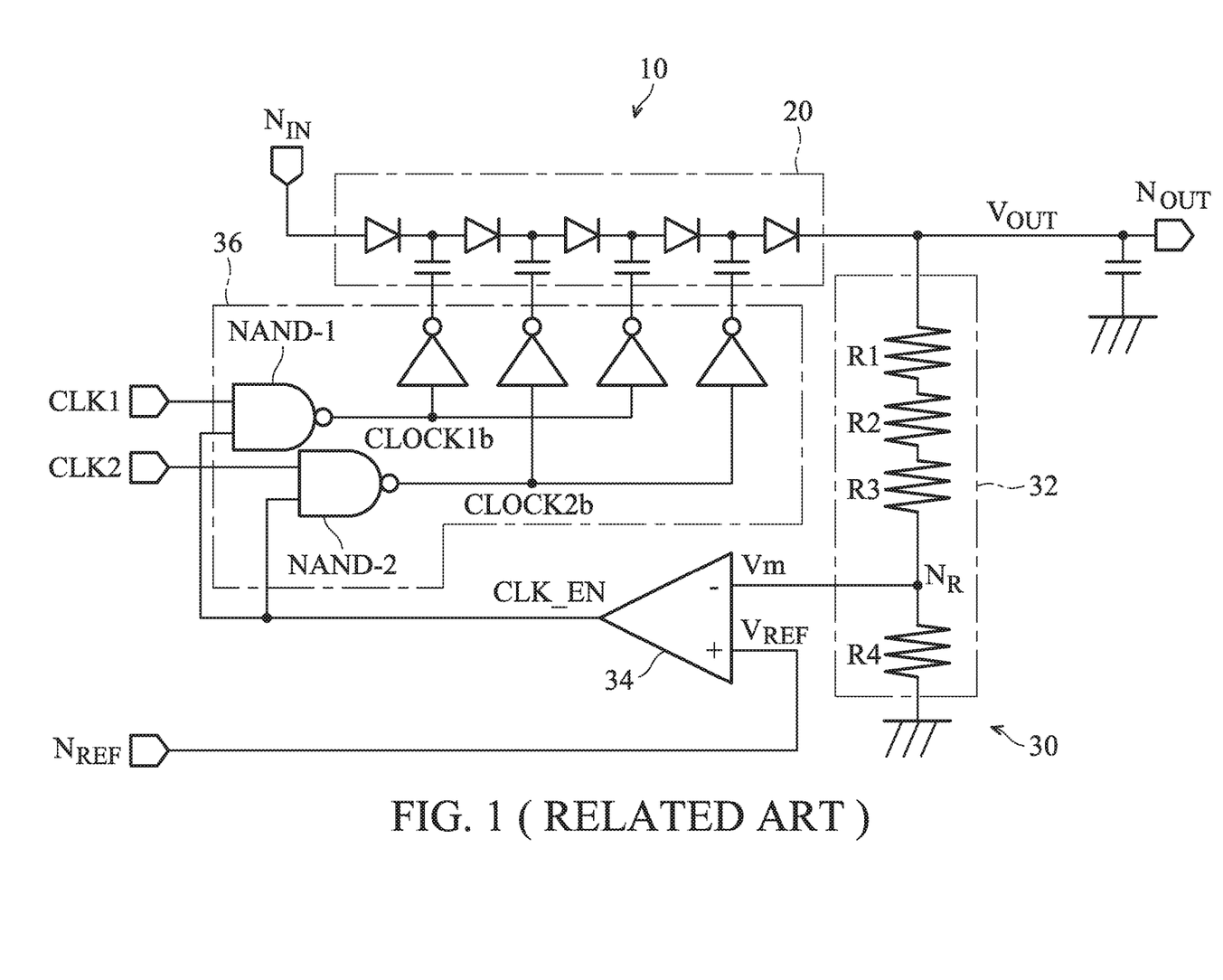
FIG. 1 shows an example of a voltage generation circuit using a conventional charge pump.
Figure 2:
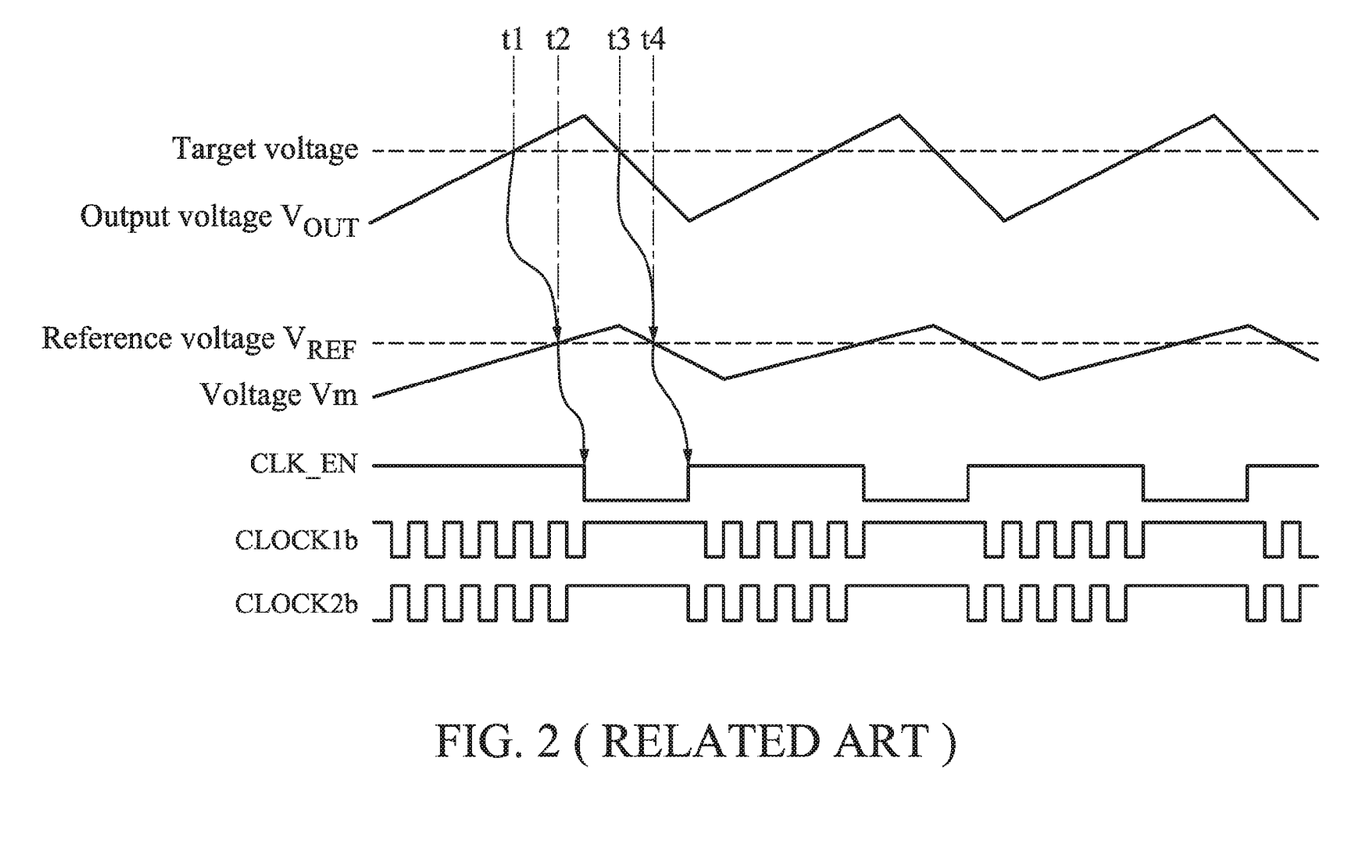
FIG. 2 shows operation waveforms of the voltage generation circuit in FIG. 1.

FIG. 1 shows an example of a voltage generation circuit using a conventional charge pump. FIG. 2 shows operation waveforms of the voltage generation circuit in FIG. 1. The voltage generation circuit 10 has a charge pump circuit 20 and a control circuit 30 which monitors a voltage generated by the charge pump circuit 20 and controls the charge pump circuit 20 based on a monitor result. The charge pump circuit 20 is constituted by connecting in series a plurality of basic circuits, each of the basic circuits comprising a capacitor and a diode (or a diode-connected MOS transistor). By applying clock to one terminal of a capacitor in the charge pump circuit 20, charges provided from an input node $N_{IN}$ are transmitted to subsequent stages at each clock and an output voltage $V_{OUT}$ is generated at an output node $N_{OUT}$. The control circuit 30 comprises a resistor voltage-division circuit 32 connected between the output node $N_{OUT}$ and a reference ground, a comparison circuit 34 and a logic circuit 36. The resistor voltage-division circuit 32 comprises a plurality of resistors R1, R2, R3 and R4 connected in series between the output node $N_{OUT}$ and the reference ground and a voltage-division node $N_R$ formed between the resistors R3 and R4, wherein a voltage Vm at the voltage-division node $N_R$ is provided to a negative input terminal of the comparison circuit 34. Moreover, a reference voltage $V_{REF}$ is provided to a positive input terminal of the comparison circuit 34 through a node $N_{REF}$. The logic circuit 36 comprises NAND logic gates NAND-1, NAND-2 and a plurality of inverters. Clock signals CLK1 and CLK2 are respectively provided to one terminal of the NAND logic gates NAND-1 and NAND-2 and the NAND logic gates NAND-1 and NAND-2 respectively output clock signals CLOCK1$b$ and CLOCK2$b$.

Next, the operation of the voltage generation circuit is described. The voltage Vm corresponding to the output voltage $V_{OUT}$ of the charge pump circuit 20 is generated at the voltage-division node $N_R$ of the resistor voltage-division circuit 32. The comparison circuit 34 compares the voltage Vm with the reference voltage $V_{REF}$. When the voltage Vm is greater than the reference voltage $V_{REF}$, the comparison circuit 34 outputs clock enable signal CLK_EN of L level. When the voltage Vm is not greater than the reference voltage $V_{REF}$, the comparison circuit 34 outputs clock enable signal CLK_EN of H level. When the clock enable signal CLK_EN is of L level, the NAND logic gate NAND-1 and NAND-2 are enabled to provide the clock signals CLK1 and CLK2 to the inverters, thereby driving the charge pump circuit 20 to boost voltage. When the clock enable signal CLK_EN is of H level, the NAND logic gate NAND-1 and NAND-2 are disabled to stop providing the clock signals CLK1 and CLK2, thereby making the charge pump circuit 20 stop boosting voltage.

As shown in FIG. 2, the voltage Vm at the voltage-division node $N_R$ reaches the reference voltage $V_{REF}$ at time t2. Time t2 is the time delayed by a first certain time from time t1 when the output voltage $V_{OUT}$ of the charge pump circuit 20 at the output node $N_{OUT}$ reaches a required voltage (that is, a target voltage). After that, the charge pump circuit 20 stops boosting voltage and the output voltage $V_{OUT}$ declines to the target voltage at time t3. At time t4 delayed by a second certain time from the time 3, the voltage Vm at the voltage-division node $N_R$ declines from the reference voltage $V_{REF}$. It takes a certain amount of time to charge or discharge the voltage-division node $N_R$. Therefore, in fact, voltage boosting is under control after the output voltage $V_{OUT}$ exceeds the target voltage and thus ripples occur in the output voltage $V_{OUT}$ at the output node $N_{OUT}$. It is desirable to reduce the ripples for stabilizing the output voltage $V_{OUT}$.

The voltage-division circuit 32 often conducts a current, and it is desirable to reduce the through (conduction) current of the voltage-division circuit 32 as far as possible for reducing power consumption. However, if the through current is reduced, then the charge/discharge time for the voltage-division node $N_R$ gets longer, and that is the reaction speed at the voltage-division node $N_R$ becoming slow, resulting in difficulty in reducing the ripples.

Figure 3:
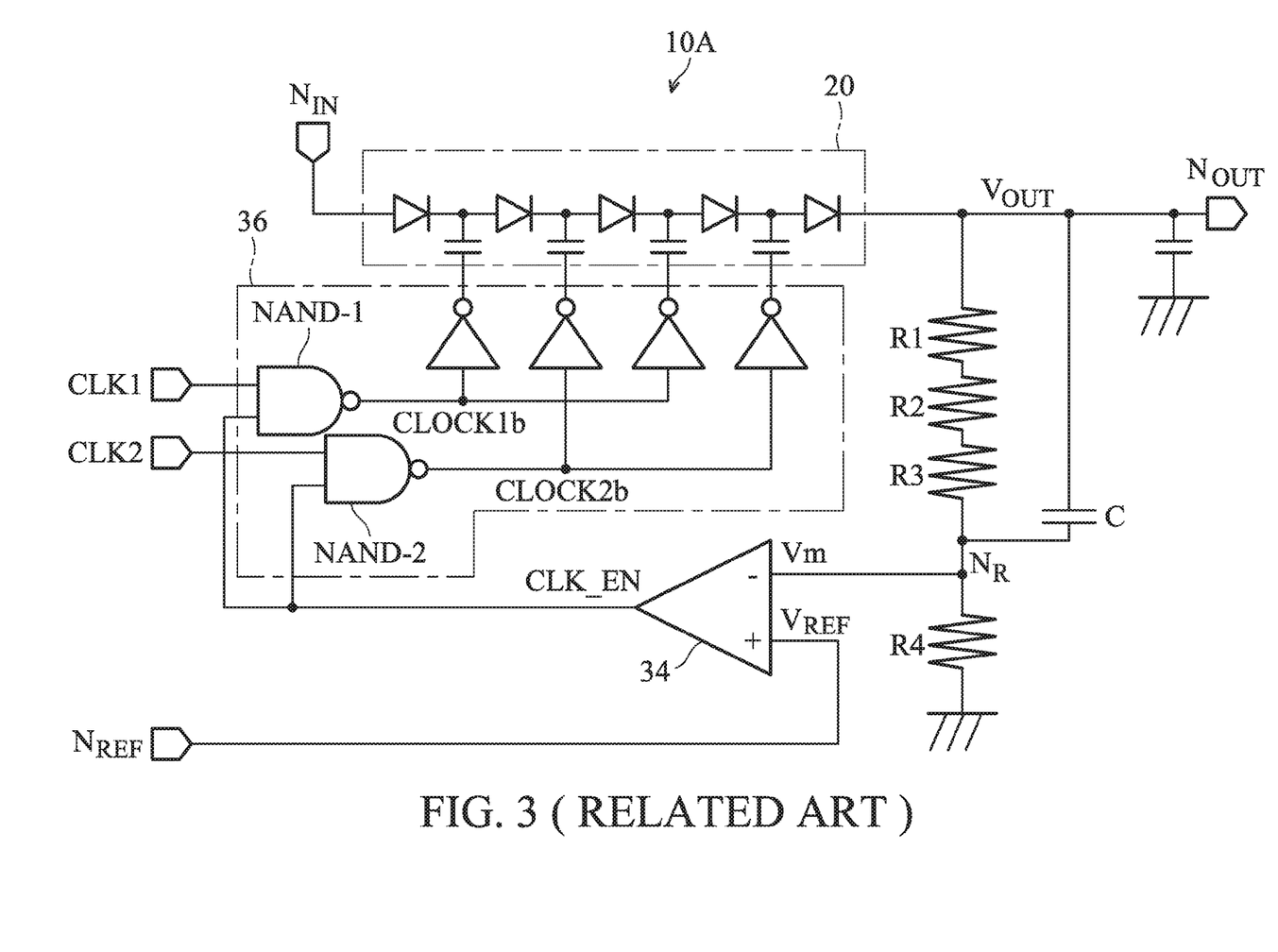
FIG. 3 shows an example of a conventional voltage generation circuit.

As depicted in FIG. 3, one way to resolve the problem is to connect a capacitor C between the output voltage node $N_{OUT}$ and the voltage-division node $N_R$ for electrically coupling the output voltage node $N_{OUT}$ to the voltage-division node $N_R$. When the output voltage $V_{OUT}$ increases toward the target voltage, before the current through the resistor device charges the voltage-division node $N_R$, the voltage Vm at the voltage-division node $N_R$ has been raised by virtue of the capacitor C. However, it is difficult to reduce the circuit layout (area) of the voltage generation circuit 10A when the capacitor C is added to the voltage generation circuit 10A. In addition, because the capacitor C electrically couples the output voltage node $V_{OUT}$ to the voltage-division node $N_R$ directly, the voltage-boosting at the voltage-division node $N_R$ may be overdone, and thus the voltage Vm may become too large (overreacted).

The object of the invention is to provide a voltage generation circuit capable of resolving the problems described above, restricting layout increasing of the circuit and stabilizing the output voltage, and to provide a semiconductor device using the voltage generation circuit.

A voltage generation circuit related to the invention comprises: a conversion circuit converting an input voltage to another voltage level and providing an output voltage after converting to an output node; a resistor voltage-division circuit coupled to the output node, generating a voltage corresponding to the output voltage; a comparison circuit comparing the voltage generated by the resistor voltage-division circuit and a reference voltage; and a control circuit controlling the conversion circuit based on a comparing result of the comparison circuit. The resistor voltage-division circuit comprises a capacitor device which is capacitively coupling at least one part of resistors in the resistor voltage-division circuit to the output node.

The capacitor device may comprise a conductor portion extending from the output node and over the at least one part of the resistors; and a dielectric layer formed between the conductor portion and the resistors. The resistors may comprise a first polysilicon layer having conductivity, formed over a substrate; the conductor portion may comprise a second polysilicon layer having conductivity, formed over the first polysilicon layer; and a dielectric layer is formed between the first and second polysilicon layers. The resistors may comprise a first polysilicon layer having conductivity, formed over a substrate; the conductor portion is a conductive region in the substrate; and a dielectric layer is formed between the first polysilicon layer and the conductive region in the substrate. The resistors may comprise a first polysilicon layer having conductivity, formed over a substrate; the conductor portion comprises a second polysilicon layer having conductivity, formed over the first polysilicon layer and a conductive region in the substrate; a first dielectric layer is formed between the first and second polysilicon layers; and a second dielectric layer is formed between the first polysilicon layer and the conductive region in the substrate. The conversion circuit may further comprise a clock circuit which is clock-enabled based on the comparing result of the comparison circuit; and the charge pump circuit responding to a clock signal from the clock circuit and providing the output voltage to the output node.

A Flash memory related to the invention comprises the voltage generation circuit as described, wherein the first polysilicon layer and a floating gate of a cell of the Flash memory are made of the same material; the second polysilicon layer and a control gate of the cell are made of the same material; and the dielectric layer and a dielectric layer formed between the floating gate and the control gate are made of the same material.

The resistor voltage-division circuit of the invention comprises a capacitor device electrically coupling at least one part of the resistors to the output node, whereby the output voltage variation at the output node can be fast reacted to the voltage-division node of the resistor voltage-division circuit and a stabilized output voltage with fewer ripples can be generated while restricting the power consumption.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Hereinafter, the exemplary embodiments of the invention will be described in detail in reference to the accompanying drawings. Moreover, drawings are shown by emphasizing a respective portion for easy understanding, and it should be noted that the dimensions thereof are not identical to those of practical devices.

Figure 4:
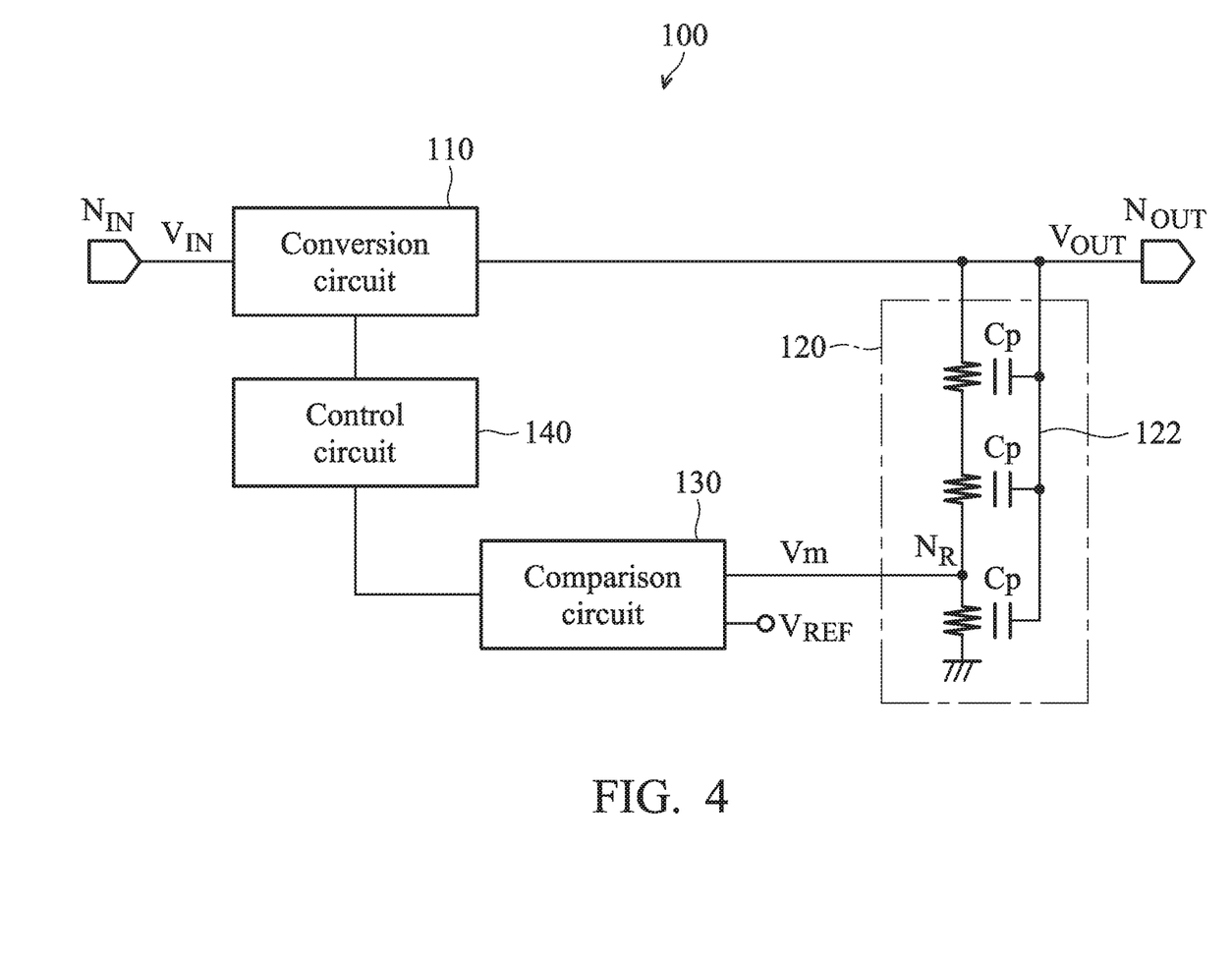
FIG. 4 shows an exemplary structure of a voltage generation circuit according to one exemplary embodiment of the invention.

FIG. 4 shows an exemplary structure of a voltage generation circuit according to one exemplary embodiment of the invention. The voltage generation circuit 100 of this embodiment comprises: a conversion circuit 110, converting an input voltage $V_{IN}$ provided by an input node $N_{IN}$ to a required voltage and outputting a converted output voltage $V_{OUT}$ to an output node $N_{OUT}$; a resistor voltage-division circuit 120 connecting the output node $N_{OUT}$; a comparison circuit 130 comparing a voltage Vm from the resistor voltage-division circuit 120 with a reference voltage $V_{REF}$; and a control circuit 140 controlling the conversion circuit 110 according to a comparing result of the comparison circuit 130.

The voltage generation circuit 100 has a feedback loop to monitor the output voltage $V_{OUT}$ generated at the node $N_{OUT}$ and control the conversion circuit 110 according to the monitor result, thereby stabilizing the output voltage $V_{OUT}$ generated at the output node $N_{OUT}$. The conversion circuit 110 is not limited to the structure described above, and it may, for example, be a charge pump, a switching mode regulator, a voltage-boosting circuit, or a voltage-bucking circuit.

The resistor voltage-division circuit 120 comprises a plurality of resistor devices connected in series between the output node $N_{OUT}$ and a reference ground, and generates a voltage Vm corresponding to the output voltage $V_{OUT}$ at a voltage-division node $N_R$. The resistor devices are made of arbitrary conductive material such as conductive wiring, layers, or regions. The resistor voltage-division circuit 120 further comprises a conduction portion 122 which is obtained by forming parasitic capacitors Cp between at least one part of the plurality of resistor devices and the output node $N_{OUT}$.

The comparison circuit 130 compares the voltage Vm at the voltage-division node $N_R$ of the resistor voltage-division 120 and the reference voltage $V_{REF}$ and provides a signal responding the comparing result to the control circuit 140. For example, when the voltage Vm is higher than the reference voltage $V_{REF}$, the comparison circuit 130 provides a signal of H level to the control circuit 140 and when the voltage Vm is lower than the reference voltage $V_{REF}$, the comparison circuit 130 provides a signal of L level to the control circuit 140.

The control circuit 140 controls the operations of the conversion circuit 110 according to the comparing result of the comparison circuit 140. For example, when the conversion circuit 110 is a voltage-boosting circuit, the voltage-boosting circuit generates the output voltage $V_{OUT}$ at the output node $N_{OUT}$ and the output voltage $V_{OUT}$ is monitored by means of the voltage Vm generated by the resistor voltage-division circuit 120. Or, when the output voltage $V_{OUT}$ is lower than the required voltage, the voltage-boosting circuit carries out voltage-boosting and when the output voltage $V_{OUT}$ is higher than the required voltage, the voltage-boosting circuit stops boosting voltage.

Current flows from the output node $N_{OUT}$ to the resistor voltage-division circuit 120 and therefore the voltage Vm is generated at the voltage-division node $N_R$. The current flowing through the resistor voltage-division circuit 120 is a through-current, and when the through-current is large, the current consumption become high. Therefore, it is desirable to lower the current flowing through the resistor voltage-divided circuit 120 as far as possible. On the other hand, reducing the through-current will result in slow reaction speed of the voltage Vm at the voltage-division node $N_R$. As a result, control by virtue of the control circuit 140 is delayed and the ripples of the output voltage $V_{OUT}$ become large. In this exemplary embodiment, to solve the problem described above, the parasitic capacitors Cp are formed between the output node $N_{OUT}$ and the resistor devices, thereby reducing the through-current flowing through the resistor voltage-division circuit 120 such that the voltage Vm responding to the output voltage $V_{OUT}$ can react quickly at the voltage-division node $N_R$. The parasitic capacitors Cp are formed by arranging the conduction portion 122 capacitively coupled with the resistor devices, but the structure of the conduction portion 122, for example, is formed by deposition or utilizes well regions. Therefore, the parasitic capacitors Cp will not substantially increase layout (area) of the voltage generation circuit, or the increased area is quite small.

Figure 5:
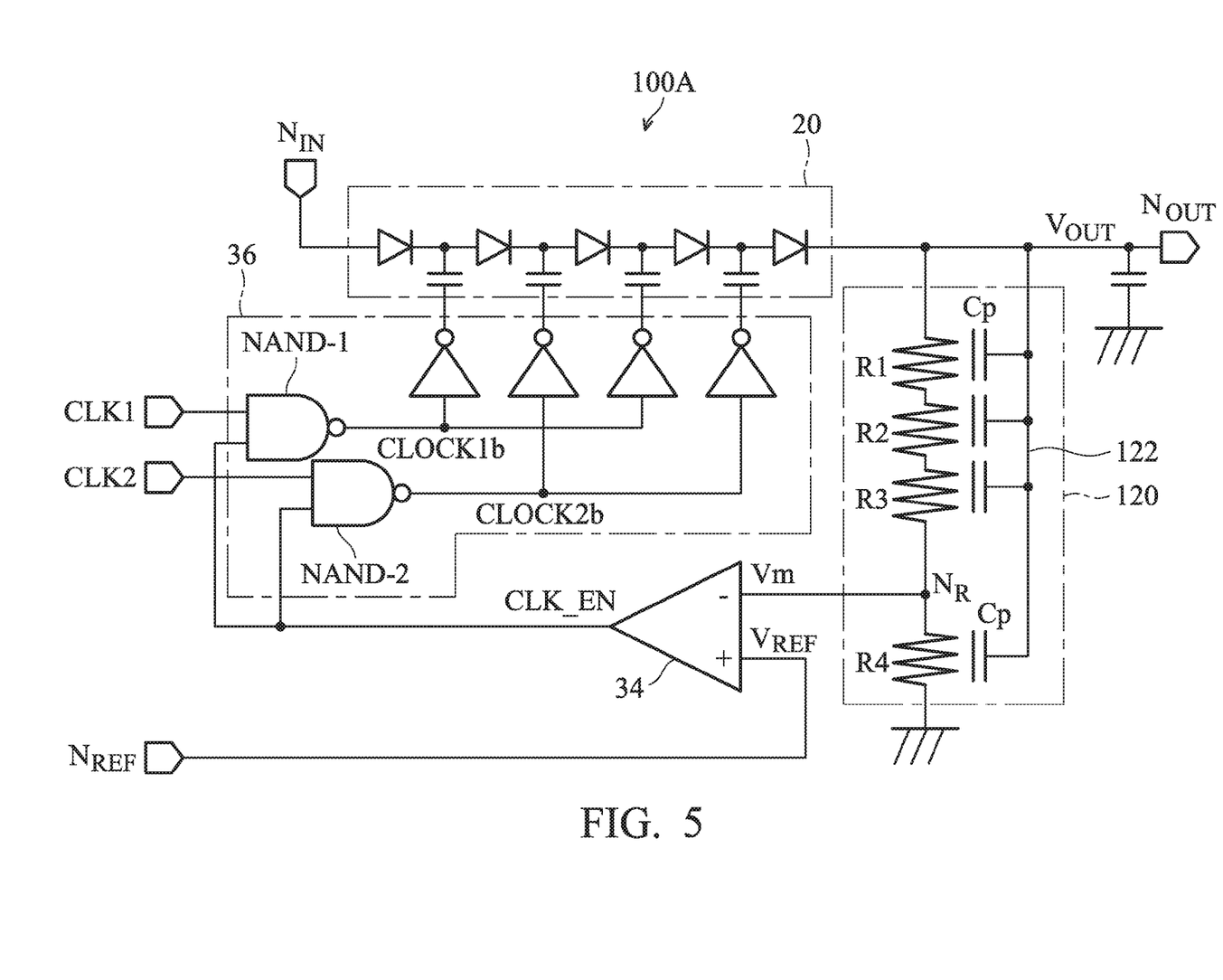
FIG. 5 shows a structure of a voltage generation circuit with a charge pump circuit according to another exemplary embodiment of the invention.

FIG. 5 shows the structure of a voltage generation circuit with a charge pump circuit according to another exemplary embodiment of the invention. The devices in FIG. 5 are the same as what is described in FIG. 1, and are indicated by the same notations or symbols, and therefore they are not described again. As shown in FIG. 5, the voltage generation circuit 100A according to the invention has a resistor voltage-division circuit 120 which has a conduction portion 122 capacitively coupled to resistors R1~R4, and the parasitic capacitors Cp are formed between the resistors R1~R4 and the output node $N_{OUT}$. The conduction portion 122, for example, is a conduction wire extending over the resistors R1~R4 by virtue of a dielectric layer.

When monitoring the output voltage $V_{OUT}$, the current through the resistors R1~R4 generates the voltage Vm at the voltage-division node $N_R$. When the output voltage $V_{OUT}$ changes, the current through the resistors R1~R4 also changes and the capacitively coupled variation will be reacted at the voltage-division node $N_R$. For example, when the output voltage $V_{OUT}$ exceeds a target voltage, a charging operation happens when the current flows through the resistors R1~R4, and the voltage Vm at the voltage-division node $N_R$ is raised due to capacitive coupling. Furthermore, when the output voltage $V_{OUT}$ is less than the target voltage, discharging operation by the resistors R1~R4 happens and the voltage Vm at the voltage-division node $N_R$ is reduced due to capacitive coupling. As described above, the variation of the output voltage $V_{OUT}$ can be responded quickly to the voltage-division node $N_R$ by setting the parasitic capacitors Cp. As a result, control delay resulting from monitoring the output voltage $V_{OUT}$ can be alleviated, thereby reducing the ripples of the output voltage $V_{OUT}$ and stabilizing the output voltage $V_{OUT}$.

Figure 6:
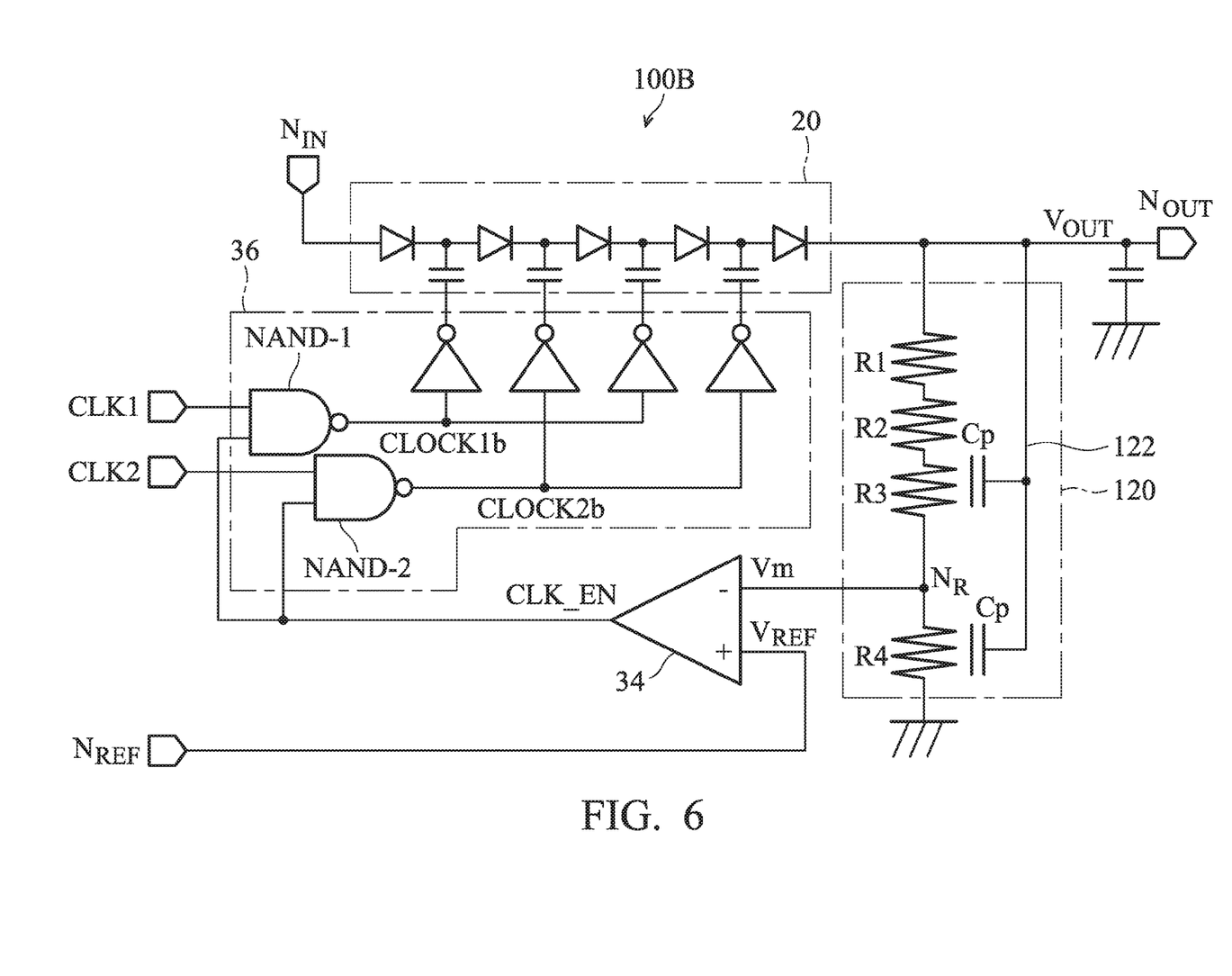
FIG. 6 shows an alternative of a voltage generation circuit of the invention.

FIG. 6 shows an alternative of the voltage generation circuit of the invention. FIG. 5 shows an example of the voltage generation circuit 100A having the parasitic capacitors Cp formed on all the resistors R1~R4. However, FIG. 6 shows an example of the voltage generation circuit 100B having the parasitic capacitors Cp formed on one part of the resistors (R3 and R4) in the resistor voltage-division circuit 120. Forming the parasitic capacitors Cp on the one part of resistor devices is to design the mentioned part of resistors closer to the voltage-division node NR. Compared to cases where the parasitic capacitor Cp is formed on the resistor R1, forming the parasitic capacitors Cp on the resistors R3 and R4 near the voltage-division node $N_R$ can make the variation of the output voltage $V_{OUT}$ be able to respond quickly to the voltage Vm at the voltage-division node $N_R$.

Figure 7:
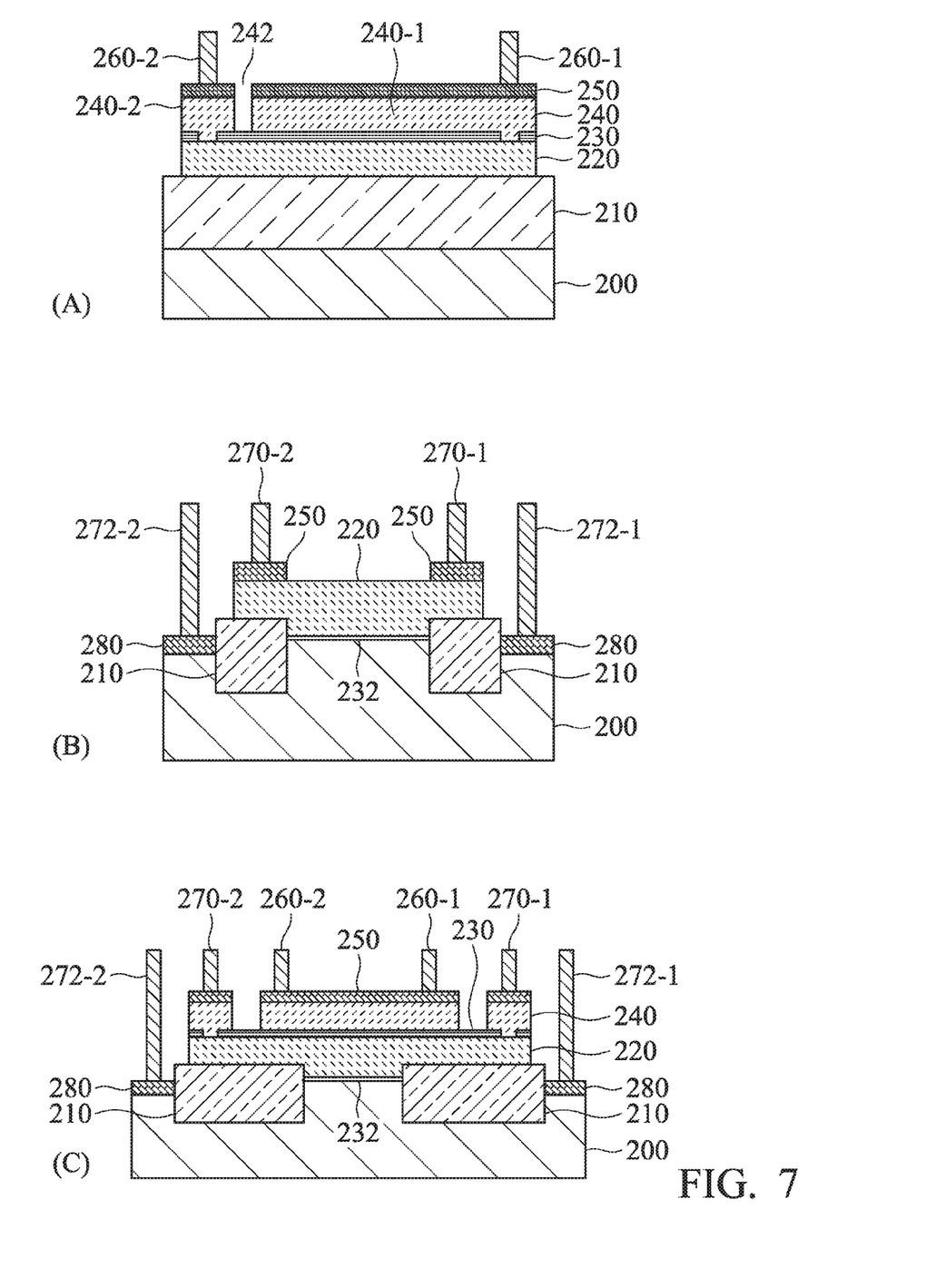
FIG. 7 schematically shows a resistor voltage-division circuit of the invention in cross-sectional view.

Next, an exemplary structure of a resistor voltage-division circuit according to an exemplary embodiment of the invention will be described in detail. FIG. 7 (A) schematically shows a resistor voltage-division circuit in cross-sectional view when the resistor voltage-division circuit is formed by utilizing the polysilicon layer of a memory cell in a NAND-type or NOR-type flash memory. In FIG. 7 (A), 200 is a silicon substrate or well region, 210 is an isolation region such as shallow trench isolation (STI) or field oxide film, 220 is an n-type polysilicon layer constructing a floating gate (FG), 230, for example, is a high dielectric layer having ONO structure of deposited silicon oxide film and silicon nitride film, 240 is an n-type polysilicon layer constructing a control gate (CG), 250 is a metal silicide layer formed on the polysilicon layer 240, and 261-1, 261-2 are contacts.

The polysilicon layer 220, for example, extends in strip on the isolation region 210. The polysilicon layer 240 is separated into a first polysilicon portion 240-1 and a second polysilicon portion 240-2 by an opening 242. The first polysilicon portion 240-1 extends over the polysilicon layer 220 by virtue of the dielectric layer 230. A via hole is formed in the dielectric layer 230 at a location corresponding to the contact 260-1, and the first polysilicon portion 240-1 electrically connects the polysilicon layer 220. Similarly, a via hole is formed in the dielectric layer 230 at the location corresponding to the contact 260-2 and the second polysilicon portion 240-2 electrically connects to the polysilicon layer 220. The polysilicon layer 220 forms a current path between the contact 260-1 and the contact 260-2 and operates as a resister device. The first polysilicon portion 240-1 extends over the polysilicon layer 220 by virtue of the dielectric layer 230, whereby parasitic capacitors are formed between the first polysilicon portion 240-1 and the polysilicon layer 220.

As an alternative of the embodiment, the contact 260-1 may correspond to the output node $N_{OUT}$ and the contact 260-2 may correspond to the voltage-division node $N_R$, but the ground electrode of the resistor voltage-division circuit is omitted. As another alternative of the embodiment, the structure of FIG. 7 (A) may serve as a basic structure and the resistor voltage-division circuit can be constructed by connecting a plurality of the basic structures in series.

A NAND-type flash memory comprises a voltage generation circuit, which uses an external power-supply voltage to generate write voltage, erase voltage and pass voltage, etc. Similarly, A NOR-type flash memory comprises a voltage generation circuit to generate write voltage or erase voltage. In a situation where the voltage generation circuit with the resistor voltage-division circuit depicted in FIG. 7 (A) is applicable to a NAND-type or NOR-type flash memory, the common (or compatible) process for fabricating the NAND-type or NOR-type flash memory can be utilized to form the resistor devices and the parasitic capacitors Cp of the resistor voltage-division circuit. In addition, the memory cell structure is applicable to a part of the voltage generation circuit, and thus the layout (area) of the voltage generation circuit can be reduced.

FIG. 7 (B) shows an example of utilizing a well region to serve as the conduction portion of the resistor voltage-division circuit. Similar to the FIG. 7 (A), the resistor device is the n-type polysilicon layer 220 formed over the substrate 200 by virtue of the dielectric layer 232. A contact 270-1 electrically connects one terminal of the polysilicon layer 220 by virtue of the metal silicide layer 250 and a contact 270-2 electrically connects the other terminal of the polysilicon layer 220 by virtue of the metal silicide layer 250. The polysilicon layer 220, for example, can be formed by a common (compatible) process for fabricating MOS transistors and the dielectric layer 232 is a silicon gate oxide film in this case. Furthermore, the n-type or p-type silicon substrate or the well region 200 electrically connects the contacts 272-1 and 272-2 by virtue of well taps 280. The well taps 280 for example are metal silicide layers. The well taps 280 are electrically isolated from the polysilicon layer 220 by virtue of the isolation region 210 such as STI, etc. In this manner, the parasitic capacitors are formed between the polysilicon layer 220 and the well region 200.

For example, the contacts 270-1 and 272-1 may correspond to the output node $N_{OUT}$ in FIG. 5 and the contact 272-2 may correspond to the voltage-division node $N_R$. In addition, the structure of FIG. 7 (B) may serve as a basic structure and the resistor voltage-division circuit can be constructed by connecting a plurality of the basic structure in series.

The structure depicted in FIG. 7 (C) is a combination of the structures depicted in FIG. 7 (A) and FIG. 7 (B). The polysilicon layer 220 between the contacts 270-1 and 270-2 works as a resistor device. The polysilicon layer 240, as described in FIG. 7 (A), formed over the polysilicon layer 220 works as a conduction wire, thereby forming the parasitic capacitor sandwiching the dielectric layer 230. Moreover, the well region 200 formed below the polysilicon layer 220 by virtue of the dielectric layer 232, as described in FIG. 7 (B), works as a conduction portion, thereby forming the parasitic capacitor sandwiching the dielectric layer 232. The capacitive coupling to the resistor device by virtue of the parasitic capacitor being further enhanced according to the structure of this embodiment.

While the invention has been described by virtue of examples and in terms of the embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage generation circuit, comprising:
   a conversion circuit converting an input voltage to another voltage level and providing an output voltage after converting, to an output node;
   a resistor voltage-division circuit coupled to the output node, generating a voltage corresponding to the output voltage;
   a comparison circuit comparing the voltage generated by the resistor voltage-division circuit and a reference voltage; and
   a control circuit controlling the conversion circuit based on a comparing result of the comparison circuit,
   wherein the resistor voltage-division circuit comprises a capacitor device which is capacitively coupling at least one part of a resistor in the resistor voltage-division circuit to the output node, and
   wherein the capacitor device comprises a conductor portion extending from the output node and over the at least one part of a resistor.

2. The voltage generation circuit as claimed in claim 1, wherein the capacitor device comprises a dielectric layer formed between the conductor portion and the resistors.

3. The voltage generation circuit as claimed in claim 2, wherein:
   the resistors comprise a first polysilicon layer having conductivity, formed over a substrate;
   the conductor portion comprises a second polysilicon layer having conductivity, formed over the first polysilicon layer; and
   a dielectric layer is formed between the first and second polysilicon layers.

4. A Flash memory, comprising the voltage generation circuit as claimed in claim 3, wherein:
   the first polysilicon layer and a floating gate of a cell of the Flash memory are made of the same material;
   the second polysilicon layer and a control gate of the cell are made of the same material; and
   the dielectric layer and a dielectric layer formed between the floating gate and the control gate are made of the same material.

5. The voltage generation circuit as claimed in claim 2, wherein:
   the resistors comprise a first polysilicon layer having conductivity, formed over a substrate;
   the conductor portion is a conductive region in the substrate; and
   a dielectric layer is formed between the first polysilicon layer and the conductive region in the substrate.

6. The voltage generation circuit as claimed in claim 2, wherein:
   the resistors comprise a first polysilicon layer having conductivity, formed over a substrate;
   the conductor portion comprises a second polysilicon layer having conductivity, formed over the first polysilicon layer and a conductive region in the substrate;

a first dielectric layer is formed between the first and second polysilicon layers; and a second dielectric layer is formed between the first polysilicon layer and the conductive region in the substrate.

7. The voltage generation circuit as claimed in claim 1, wherein the conversion circuit comprises a charge pump circuit.

8. The voltage generation circuit as claimed in claim 7, wherein:

the conversion circuit further comprises a clock circuit which is clock-enabled based on the comparing result of the comparison circuit; and the charge pump circuit responds to a clock signal from the clock circuit and provides the output voltage to the output node.

9. A semiconductor device, comprising a voltage generation circuit, wherein the voltage generation circuit comprises:

a conversion circuit converting an input voltage to another voltage level and providing an output voltage after converting, to an output node;

a resistor voltage-division circuit coupled to the output node, generating a voltage corresponding to the output voltage;

a comparison circuit comparing the voltage generated by the resistor voltage-division circuit and a reference voltage; and a control circuit controlling the conversion circuit based on a comparing result of the comparison circuit, wherein the resistor voltage-division circuit comprises a capacitor device which is capacitively coupling at least one part of a resistor in the resistor voltage-division circuit to the output node, and wherein the capacitor device comprises a conductor portion extending from the output node and over the at least one part of a resistor.

10. The semiconductor device as claimed in claim 9, wherein the capacitor device comprises a dielectric layer formed between the conductor portion and the resistors.

11. The semiconductor device as claimed in claim 10, wherein:

the resistors comprise a first polysilicon layer having conductivity, formed over a substrate;

the conductor portion comprises a second polysilicon layer having conductivity, formed over the first polysilicon layer; and a dielectric layer is formed between the first and second polysilicon layers.

12. The semiconductor device as claimed in claim 10, wherein:

the resistors comprise a first polysilicon layer having conductivity, formed over a substrate;

the conductor portion is a conductive region in the substrate; and a dielectric layer is formed between the first polysilicon layer and the conductive region in the substrate.

13. The semiconductor device as claimed in claim 10, wherein:

the resistors comprise a first polysilicon layer having conductivity, formed over a substrate;

the conductor portion comprises a second polysilicon layer having conductivity, formed over the first polysilicon layer and a conductive region in the substrate;

a first dielectric layer is formed between the first and second polysilicon layers; and a second dielectric layer is formed between the first polysilicon layer and the conductive region in the substrate.

14. The semiconductor device as claimed in claim 9, wherein the conversion circuit comprises a charge pump circuit.

15. The semiconductor device as claimed in claim 14, wherein:

the conversion circuit further comprises a clock circuit which is clock-enabled based on the comparing result of the comparison circuit; and the charge pump circuit responds to a clock signal from the clock circuit and provides the output voltage to the output node.

* * * * *